US006841812B2

(12) United States Patent
Zhao

(10) Patent No.: US 6,841,812 B2
(45) Date of Patent: Jan. 11, 2005

(54) DOUBLE-GATED VERTICAL JUNCTION FIELD EFFECT POWER TRANSISTOR

(75) Inventor: Jian Hui Zhao, North Brunswick, NJ (US)

(73) Assignee: United Silicon Carbide, Inc., New Brunswick, NJ (US)

( * ) Notice: Subject to any disclaimer, the term of this patent is extended or adjusted under 35 U.S.C. 154(b) by 268 days.

(21) Appl. No.: 10/289,907

(22) Filed: Nov. 7, 2002

(65) Prior Publication Data

US 2003/0089930 A1 May 15, 2003

Related U.S. Application Data

(60) Provisional application No. 60/348,232, filed on Nov. 9, 2001.

(51) Int. Cl.[7] ........................ H01L 29/80; H01L 29/76; H01L 29/94
(52) U.S. Cl. ........................ 257/256; 257/329; 257/341
(58) Field of Search .............................. 257/256, 329, 257/341, 348, 123

(56) References Cited

U.S. PATENT DOCUMENTS 6,107,649 A * 8/2000 Zhao .......................... 257/138
6,423,986 B1 * 7/2002 Zhao .......................... 257/138
6,791,143 B2 * 9/2004 Baliga ........................ 257/328

OTHER PUBLICATIONS

Status and Prospects for SiC Power MOSFETs James A. Cooper, Jr., Michael R. Melloch, Ranbir Singh, Anant Agarwal, and John W. Palmour IEEE Transactions on Electron Devices, vol. 49, No. 4, Apr. 2002.

A 600 V SiC Trench JFET R.N. Gupta, H.R. Chang E. Hanna, and C. Bui Materials Science Forum, vols. 389–393 (2002), pp. 1219–1222.

Application–Oriented Unipolar Switching SiC Devices P. Friedrichs, H. Mitlehner, R. Schorner, K. Dohnke, R. Elpelt, and D. Stephani Materials Science Forum, vols. 389–393 (2002), pp. 1185–1190.

5kV 4H–SiC SEJFET with Low RonS of 69m–ohm–cm2 K. Asano, Y. Sugawara, T. Hayashi, S. Ryu, R.Singh, J. Palmour, and D. Takayama Proc. 14th Int. Symp., Power Semiconductor Devices and IC's, Piscataway, NJ, IEEE, 2002.

2kV 4H–SiC Junction FETs H. Onose, A. Watanabe, T. Someya, and Y. Kobayashi Materials Science Forum, vols. 389–393 (2002), pp. 1227–1230.

* cited by examiner

Primary Examiner—Amr Zarabian
Assistant Examiner—Kiesha Rose
(74) Attorney, Agent, or Firm—Michael Crilly, Esq.

(57) ABSTRACT

The present invention is a power semiconductor switch having a monolithically integrated low-voltage lateral junction field effect transistor (LJFET) controlling a high-voltage vertical junction field effect transistor (VJFET). The low-voltage LJFET conducting channel is double-gated by p+n junctions at opposite sides of the lateral channel. A buried p-type epitaxial layer forms one of the two p+n junction gates. A p+ region created by ion implantation serves as the p+ region for the second p+n junction gate. Both gates are electrically connected by a p+ tub implantation. The vertical channel of the vertical JFET is formed by converting part of the buried p-type epitaxial layer into n+ channel via n-type ion implantation.

8 Claims, 9 Drawing Sheets

DOUBLE-GATED VERTICAL JUNCTION FIELD EFFECT POWER TRANSISTOR

NON-PROVISIONAL PATENT APPLICATION

CROSS REFERENCE TO RELATED APPLICATIONS

This application claims benefit under 35 U.S.C. 119(e) from U.S. Provisional Application No. 60/348,232 filed on Nov. 9, 2001.

FEDERALLY SPONSORED RESEARCH OR DEVELOPMENT

None.

BACKGROUND OF THE INVENTION

1. Field of the Invention

The present invention generally relates to a power semiconductor switch. Specifically, the invention is a power switch in which a double-gated, normally-off, low-voltage lateral junction field effect transistor (LJFET) is employed to control a normally-on, high-voltage vertical junction field effect transistor (VJFET).

2. Background

An ideal power semiconductor switch possesses important features, capabilities, and characteristics. A normally-off feature is significantly important to power systems since it avoids the dangers and design complications of normally-on designs, especially at high power levels. A voltage control capability is a widely desired advantage thereby spurring the replacement of silicon (Si) power BJTs and Darlingtons current-controlled devices by voltage-controlled FETs (MOSFETs) and IGBTs and more recently the replacement of Si HV-IGBTs by Si GTOs. A negative temperature coefficient characteristic ensures higher reliability by forcing device current to decrease when a local hot spot develops thereby preventing thermal runaway. A low forward voltage drop characteristic ensures low conduction loss and heat generation. A high speed capability reduces both size and weight of reactive components in a power system. Unipolar operation ensures negligible storage charge resulting in low switching losses and reduced switching spikes therefrom higher system reliability.

It is well known that Si IGBTs, bipolar switch types, dominate the higher power end of the commercial market because Si MOSFETs, unipolar switch types, lack conductivity modulation and possess a higher forward voltage drop than Si IGBTs. However, there is no such problem with silicon carbide (SiC) unipolar MOSFETs and JFETs because higher electric field strength and higher doping concentrations make it possible to reduce the specific ON resistance by a few hundred times.

Power semiconductor switches are generally required to handle high power inevitably leading to ohmic losses and heating. Switch heating influences the ultimate limit of power handling capability. In order to operate at high temperatures, the semiconductor requires a large band gap so that the intrinsic carrier concentration is not high enough to cause switch malfunction. Wide band gap semiconductors, one example being SiC, are attractive for this reason. SiC is the only wide band gap semiconductor (3.2 eV band gap for 4H-SiC) for which large area substrate is commercially available. Also, it is an indirect band gap semiconductor with a high thermal conductivity, typically ten times that of GaAs and three times that of Si.

SiC power devices have been intensively investigated. Most efforts have been focused on power switches based on MOSFET technology. MOSFET-based power switches have low reliability due to gate oxide failure, especially at high temperatures. A variety of designs have been proposed to address this issue as described in *Status and prospects for SiC power MOSFETs*, IEEE Transaction on Electron Devices, Vol. 49, No.4, April 2002.

Gate oxide/insulator reliability, especially at high temperatures, is a major problem for devices such as ACCUFETs, IGBTs, MCTs and MTOs that require MOSFETs or MISFETs for gating. Even when SiC power switches are not used in a high temperature environment their junction temperatures are high, especially where limited space is available.

Gate oxide/insulator reliability at high field and temperature conditions is a much more challenging problem in comparison to the low inversion layer mobility problem hindering the application of SiC MOSFET-based power switches because silicon dioxide ($SiO_2$) on SiC is reasonably assumed to have a quality similar to $SiO_2$ on Si, which does not have carbon atoms to compromise the quality of $SiO_2$. $Si/SiO_2$ technology has a 2 MV/cm maximum field limit in $SiO_2$ so as to achieve a 10-year reliability. Whereas, a $SiC/SiO_2$ structure requires at least a 4 MV/cm field in $SiO_2$ in order to exploit the advantage of high electric field strength offered by the SiC.

$SiO_2/SiC$ structures have an intrinsically lower reliability than $SiO_2/Si$ structures due to a much larger charge injection into $SiO_2$ from SiC resulting from a smaller injection barrier, 2.70 eV for $4H-SiC/SiO_2$ barrier versus 3.15 eV for $Si/SiO_2$ barrier. The exponential dependence of the hot carrier density distribution on energy makes $4H-SiC/SiO_2$ systems more susceptible to high temperature reliability failure than $Si/SiO_2$ systems. Therefore, the need exists for power switches free of gate oxide or gate insulator for high temperature and high power applications. Thyristors, GTO thyristors, and BJTs are free of gate oxide or insulators, but are latch-on devices or current controlled switches and not as desirable for many power control applications.

While novel MOSFET designs may substantially reduce the electric field across the gate oxide in the channel region, there remains a high electric field across the gate oxide in source-to-gate and drain-to-gate overlap regions. Source and drain regions are generally subjected to ion implantation techniques and high temperature annealing. Oxide quality in such regions is substantially degraded causing further reliability concerns with the MOSFET-based SiC power switches within high temperature operations.

Junction field effect transistors (JFETs) have been proposed to solve the gate oxide reliability problem at high electric field and temperature conditions as described by Zhao in U.S. Pat. No. 6,107,649 issued Aug. 22, 2000 and U.S. Pat. No. 6,423,986 issued on Jul. 23, 2002. Power JFETs are typically normally-on devices and as such not as desirable for high power system applications. See R. N. Gupta et al., *A 600 V SiC Trench JFET*, Materials Science Forum, Vols. 389–393, pp. 1219–1222, 2002; H. Onose et al., *2 kV 4H-SiC Junction FETs*, Materials Science Forum, Vols. 389–393, pp. 1227–1230, 2002; P. Friedrichs, et al., *Application-Oriented Unipolar Switching SiC Devices*, Materials Science Forum, Vols. 389–393, pp. 1185–1190, 2002. However, JFET designs are either normally-on which is not desirable for power switching, see Friedrichs et al., Gupta et al., and Onose et al., or require epitaxial regrowth which not only increases cost but also fabrication complexity thereby limiting device yield, see Friedrichs et al. and K. Asano et al., 5 kV 4H-SiC SEJFET with Low RonS of 69 mΩcm², Proc. 14$^{th}$ Int. Symp., Power Semiconductor Devices and IC's, Piscataway, N.J., IEEE, 2002. Epitaxial regrowth is an undesirable approach not only because it is costly but also due to its effect on decreasing power device yield.

What is required is a junction field effect transistor (JFET) that is normally-off, offers improved performance over the related art, and eliminates epitaxial regrowth during device fabrication.

SUMMARY OF THE INVENTION

An object of the present invention is to provide a double-gated junction field effect transistor that is normally-off having improved operating performance characteristics over the related arts.

A further object of the invention is to provide a double-gated junction field effect transistor that eliminates an epitaxial regrowth step during fabrication.

The present invention relates to a power semiconductor switch offering a higher current capability with a lower forward voltage drop as compared to the related art. The invention incorporates a monolithically integrated double-gated low-voltage lateral JFET (LJFET) to control a high-voltage vertical JFET (VJFET), thus forming a double-gated VJFET (DG-VJFET). In the present invention, a buried epitaxial layer is employed to form a high voltage blocking p–n junction in the power switch, as well as to function as a gate for the low-voltage LJFET.

The double-gated structure facilitates a doubling of the channel opening within the low-voltage LJFET. Because a normally-off power switch current capability is limited by the low-voltage LJFET current capability, doubling the channel opening substantially increases the current capability and decreases the forward voltage drop.

The present invention provides a monolithic normally-off semiconductor power switch thereby advancing power switch technology in two important aspects. A buried epitaxial layer serves not only as one of the two required semiconductor layers in a p–n junction responsible for high voltage blocking but also as a gate for the LJFET so that a wider channel opening within the LJFET is possible. The result is a substantially increased total current or a greatly reduced on-state voltage drop. The present invention totally eliminates the parasitic p–n–p transistor punch-through problem without a semi-insulating layer. Furthermore, the present invention substantially simplifies power switch fabrication while greatly increasing current capability.

BRIEF DESCRIPTION OF THE DRAWINGS

The invention will now be described in more detail, by way of example only, with reference to the accompanying drawings, in which:

FIG. 5B is an enlarged sectional view showing one-half of a single-gated VJFET with semi-insulating layer to eliminate punch-through.

REFERENCE NUMERALS

Figure 1A:
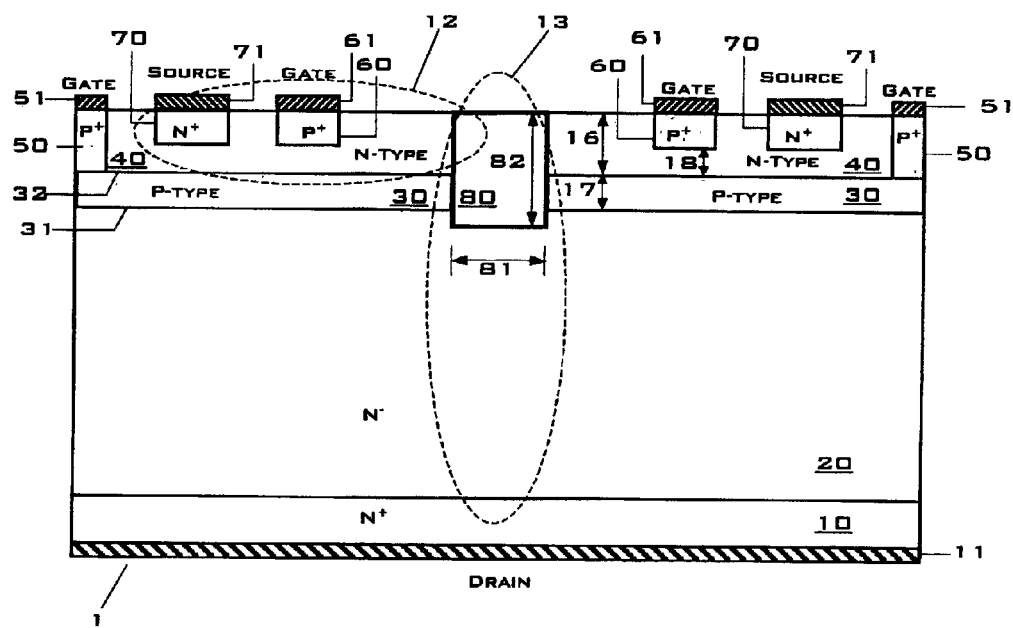
FIG. 1A is an enlarged sectional view of the present double-gated VJFET.

1 DG-VJFET
10 Substrate
11 Ohmic contact
12 LJFET
13 VJFET
16 Width
17 Depth
18 Lateral channel opening
20 Drift layer
21 Current spreading layer
30 P-type layer
31 P-n junction
32 P-n junction
40 N-type layer
50 P$^+$ subregion
51 Metal gate contact
60 P$^+$ subregion
61 Metal gate contact
62 Shaped p$^+$ subregion
63 Major width
64 Minor width
65 Metal gate
66 P$^+$ subregion
70 N$^+$ subregion
71 Source contact
80 Vertical channel
81 Vertical channel width
82 Channel depth
90 Vertically-oriented channel
91 Trench
94 Trench depth
95 Sidewall thickness
96 Sidewall angle
97 Sidewall
100 Semi-insulating layer

DESCRIPTION OF THE INVENTION

The present invention will now be described more fully hereafter with reference to the accompany drawings, in which preferred embodiments of the invention are described with SiC semiconductor serving as an example. The invention may, however, be embodied in many different forms for many different semiconductors including but not limited to GaN, AlGaN, GaP, AlGaAs, diamond, ZnO, and ZnO based materials among other semiconductors.

Referring to FIG. 1A, an enlarged sectional view is shown of a semiconductor power switch, referred to as a DG-VJFET 1, comprised of several layers. A planar-shaped substrate 10 composed of a heavily doped n-type semiconductor material known within the art is provided as the first layer and functionally facilitates ohmic contact formation. A lightly-doped yet thicker n-type drift layer 20 composed of material known within the art is likewise planar disposed and contacting the substrate 10. A planar disposed p-type layer 30 composed of material understood within the art is thereafter provided in contact along the drift layer 20 and opposite of the substrate 10. Properties of the p-type layer 30, namely doping and thickness, are such so that a pre-determined high voltage is blocked by the p–n junction 31. A planar disposed n-type layer 40 composed of material understood within the art contacts the p-type layer 30 opposite of the drift layer 20. A planar disposed n-type ohmic contact 11 is provided along the substrate 10 opposite of the drift layer 20 and serves as a drain.

The p-type layer 30 is formed via epitaxial growth with techniques understood in the art so that abrupt p–n junctions 31, 32 are formed. The p-type layer 30 is more heavily doped than the n-type layer 40 so that a larger portion of the depletion region is provided within the n-type layer 40. The p-type layer 30 between drift layer 20 and n-type layer 40 serves as a gate layer by p implantation converting the p+ subregion 50 from n-type to p-type thereby completing first gate contact with the metal gate contact 51. Likewise, the p+ subregion 60 is converted from n-type to p-type by p implantation thereby providing a second gate having a metal gate contact 61. Thereafter, the second gate is monolithically connected to the first gate by a metal connection. An n+ subregion 70 is implanted by donors to form a heavily doped n-type source contacting a source contact 71.

The vertical channel 80 is an n-type semiconductor extending through the p-type layer 30 and having a predetermined channel depth 82. Preferably, the vertical channel 80 possesses a doping concentration higher than the p-type layer 30, at least where the two regions overlap. The vertical channel 80 is formed by n-type ion implantation of nitrogen or phosphorous or a combination of the two via techniques understood in the art.

Again referring to FIG. 1A, the substrate 10 is a heavily doped n-type SiC semiconductor substrate with a doping value of at least $10^{18}$ cm$^{-3}$. The lightly-doped, n-type drift layer 20 is epitaxially grown to a thickness with a doping value sufficient to insure the blocking voltage governed by Poisson's equation. For example, a 12 micron thick layer doped to approximately $7 \times 10^{15}$ cm$^{-3}$ results in a blocking voltage of 1 to 1.5 kV. The buried p-type layer 30 is then formed by epitaxial growth so as to have a doping value and thickness such that a pre-determined high voltage is blocked by the p–n junction 31 without punch-through of the p-type layer 30.

The p-type layer 30 serves not only as part of the blocking p-n junction 31 but also as a gate for the LJFET 12 formed by the channel directly above the p-type layer 30 and below p+ subregion 60 and n+ subregion 70. The resultant LJFET 12 is double-gated allowing a doubling of the lateral channel opening 18 in comparison to a channel opening without using the p-type layer 30 as a gate layer. The p-type layer 30 used as a gate completely eliminates punch-through of the parasitic p–n–p transistor formed by p+ subregion 60, n-type layer 40, and p-type layer 30. Punch-through is eliminated without a semi-insulating layer 100 between layer 40 and layer 30, as shown in FIG. 5B.

Although the p-type layer 30 can also be formed by p-type ion implantation, it is not desirable to do so in the present invention because the implanted ion distribution tail will penetrate substantially into the n-type layer 40, resulting in substantially increased carrier scatter and associated mobility degradation. Rather the n-type layer 40 is epitaxially grown onto the epitaxial p-type layer 30 forming an abrupt p–n junction 32 and facilitating high electron mobility along the LJFET 12.

After structure growth, implantation methods are applied to form p+ subregion 50, p+ subregion 60, n+ subregion 70, and vertical channel 80. To form the p+ subregion 50, an implantation mask composed of a photoresist material or heavy metal, examples including molybdenum or tungsten, is formed on the n-type layer 40 via photolithography methods understood in the art followed by Al or C plus Al ion implantation into subregion 50 thereby connecting the buried p-type layer 30 to the device surface. A second ion implantation mask is formed on the n-type layer 40 via photolithography for the shallower Al or Al plus C ion implantation into subregion 60 forming a heavily doped p-type gate. To achieve a normally-off DG-VJFET 1, the second implantation depth forms a lateral channel opening 18 smaller than the total intrinsic built-in depletion width extending into the n-type layer 40 bounded by p+ layer 30 and p+ subregion 60. Next, the n+ subregion 70 is formed by implanting nitrogen or phosphorous to create a heavily doped source after application of photoresist or heavy metal mask to the n-type layer 40. Finally, an n-type ion implantation of nitrogen or phosphorous or a combination of nitrogen and phosphorous is performed via techniques understood in the art to create the vertical channel 80 having an electron concentration larger than the concentration of holes in the p-type layer 30.

The vertical channel 80 along the VJFET 13 extends to a channel depth 82 so that so a portion of the vertical channel is bordered by the p-type layer 30, as shown in FIG. 1A. The vertical channel width 81 is a critical parameter thereby influencing the blocking voltage performance of the switch. If too large, the vertical channel 80 can not be substantially depleted by the voltage applied between the p-type layer 30 and the n-type vertical channel 80. If too small, current conduction between source and drain is blocked and a high current capability is not achieved. For example, the electron concentration in the vertical channel 80 is about $6 \times 10^{17}$ cm$^{-3}$ at a vertical channel width 81 of 1.32 microns when the p+ subregion 30 has a value of about $4.2 \times 10^{17}$ cm$^{-3}$.

The resultant wafer formed by the implantation steps described above is placed into a SiC container and thereafter loaded into a high temperature furnace for post-implantation activation annealing at a temperature between 1400–1750 C. and preferably between 1550–1650 C. Next, a multi-step junction termination extension is etched onto the p-type region 30. The wafer surface is passivated with dielectric films. For example, the SiO$_2$ is thermally grown at 1100 C. from 30 to 120 minutes, followed by a thicker LPCVD SiO$_2$ and CVD nitride of approximately 1 micron. Ohmic contacts to p+ subregions 50, 60, n+ subregions 70, and substrate 10 are formed by standard photolithographic lift-off processes. For example, sputtered nickel can be used as an n-type contact and Al, Al—Ti alloy or Ti—W is typically used as p-type contact.

The DG-VJFET 1 operates in a blocking mode with a positive high voltage applied to the ohmic contact 11 with respect to the source with the source-to-gate voltage equal zero which leaves no conducting channel under the gate for a normally-off design. The high voltage is blocked by the reverse biased p–n junction 31. The vertical channel 80 is substantially depleted under a large reverse bias across the p-type layer 30 and the vertical channel 80. The DG-VJFET 1 is ON when a positive gate-to-source voltage is applied which reduces the depletion regions of the top p+n junction and the bottom p+n junction, opening up the conducting channel of the LJFET 12. As a result, source electrons flow to the vertical channel 80 and down into the drift layer 20 causing voltage across the device to collapse and a large current to flow between drain and source.

Figure 1B:
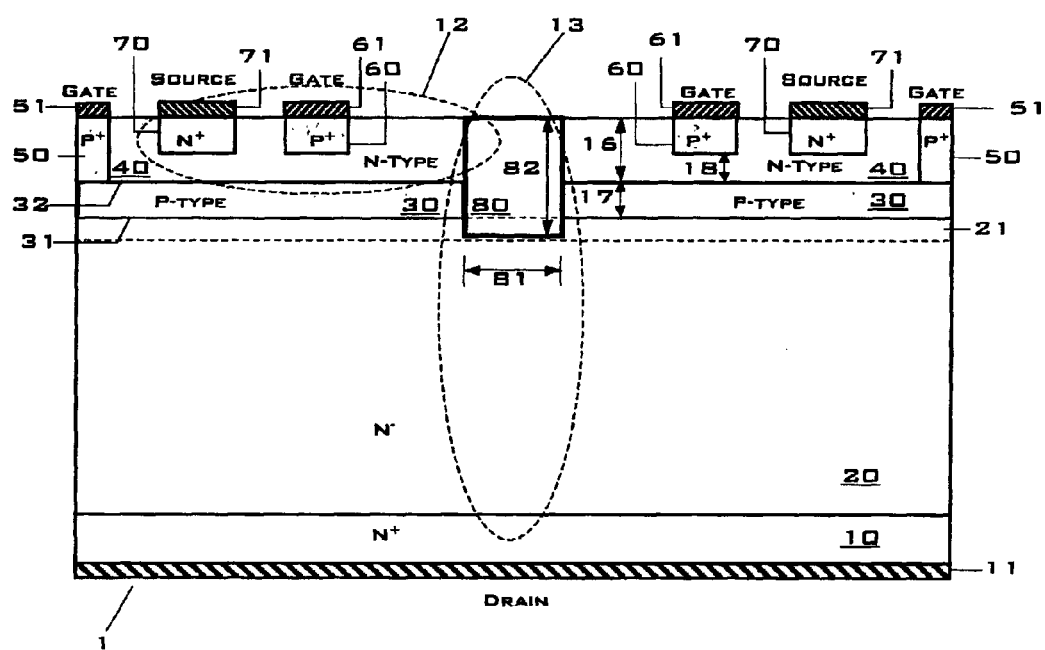
FIG. 1B is an enlarged sectional view of the present double-gated VJFET with current spreading layer.

Referring to FIG. 1B, the DG-VJFET 1 is further improved when designed for blocking voltages in the range of a few thousand volts. For high voltage devices, the drift layer 20 doping density is low. By inserting a thin but more heavily doped current spreading layer 21, electrons from the source 71 are spread out laterally resulting in reduced resistance and increased forward current capability. While various thickness and doping concentrations are possible, a thickness in the range of 0.1 to 0.8 µm and a doping concentration between $10^{16}$ cm$^{-3}$ and $10^{17}$ cm$^{-3}$ are typical. The described current spreading layer 21 is applicable to embodiments described in FIGS. 2–4.

Figure 2:
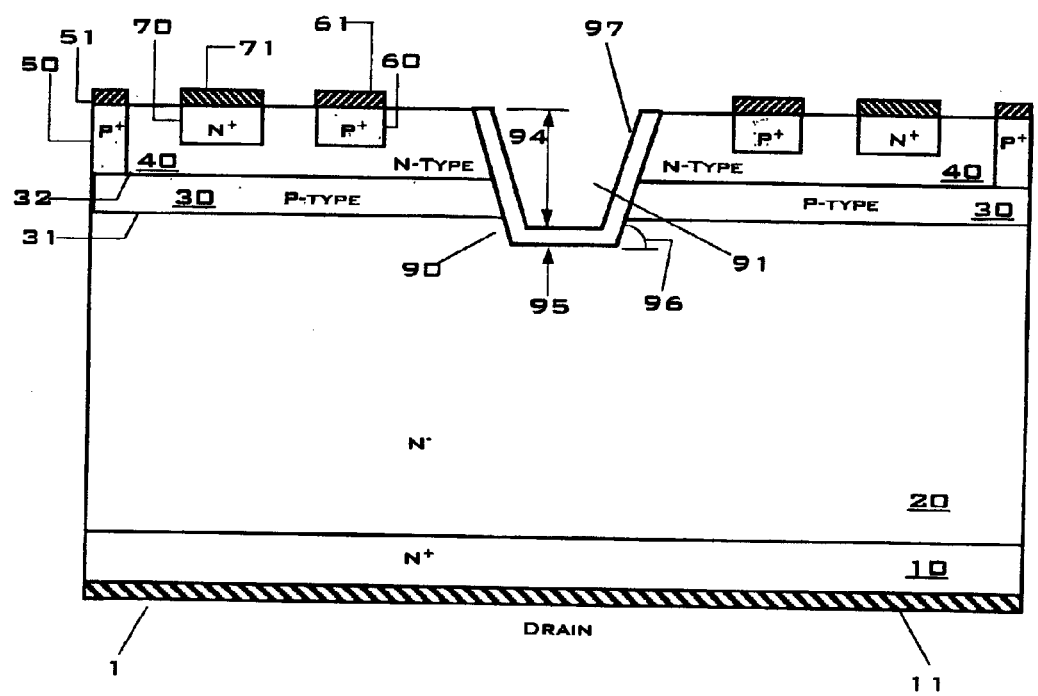
FIG. 2 is an enlarged sectional view of an alternate embodiment of the present invention having a trench structure with the vertical channel.

Referring now to FIG. 2, the vertical channel 80 may be shaped so as to form a trench 91 with a heavily n-type implanted surface. The vertically-oriented channel 90 is formed first by etching a trench-like shape and thereafter implanted via a lower energy shallow n-type implantation to convert a thin layer of the semiconductor surface to a heavily n-type doped semiconductor. The trench 91 may also be formed by implantation first followed by etching. The heavily doped surface layer connects the drift layer 20 and n-type layer 40 so that a normally-on conducting channel exists between draft layer 20 and n-type layer 40 unless a large voltage is applied between the blocking p–n junction 31. With a large voltage across the blocking p–n junction 31, the thin but heavily doped vertically-oriented channel 90 becomes deleted adjacent to p-type layer 30.

The sidewalls 97 of the vertically-oriented channel 90 are implanted to be heavily n-type. The sidewall thickness 95 and electron concentration are such that a reverse bias across the blocking p–n junction 31 depletes the sidewall 97 n-layer. Preferably, the sidewall 97 n-layer should have a thickness in the range of 0.1 to 0.5 microns depending on doping concentration which is typically at least $10^{17}$ cm$^{-3}$ yet less than $10^{19}$ cm$^{-3}$, however other concentrations are possible dependent on device design and performance.

A trench 91 is etched into the vertically-oriented channel 90 via techniques understood in the art and determined by mask shape. While FIG. 2 shows one possible shape, others are likewise applicable including U-shapes and V-shapes. For example, the trench 91 shown in FIG. 2 might have a sidewall angle 96 for vertical orientation (90°) or an angled (<90°) wherein the latter is preferred because of the convenience in performing n-type implantation. Vertically oriented sidewalls 97 are implanted with or without tilting the sample during ion implantation.

Figure 3:
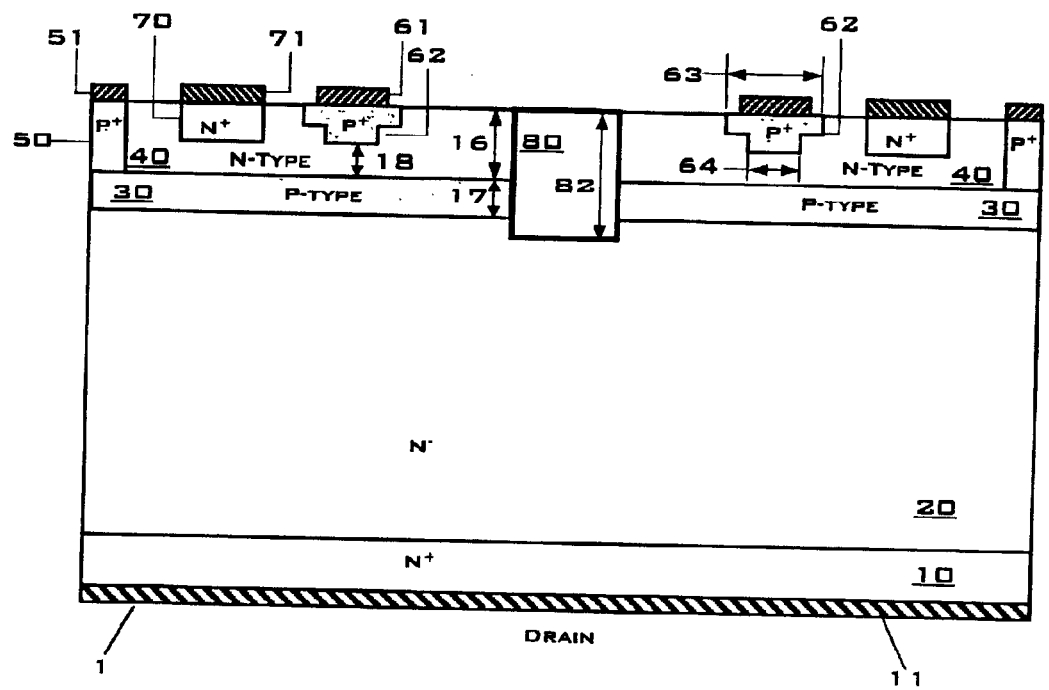
FIG. 3 is an enlarged sectional view of an alternate embodiment of the present invention having a shaped gate design.

Referring to FIG. 3, a sectional view of an alternate embodiment of the present DG-VJFET 1 is shown having a shaped p+ subregion 62. While various subregion shapes are possible, a shaped p+ subregion 62 should have a minor width 64 of smaller dimension than that of the metal gate contact 61 and a major width 63 at least that of the metal gate contact 61. The primary benefit of the present embodiment is reduced resistance within the lateral channel. The p implantation of the shaped p+ subregion 62 is achieved by masking the region surrounding the minor width 64 with a thin layer of dielectric film or photoresist. A single implantation step provides the desired shape.

Figure 4:
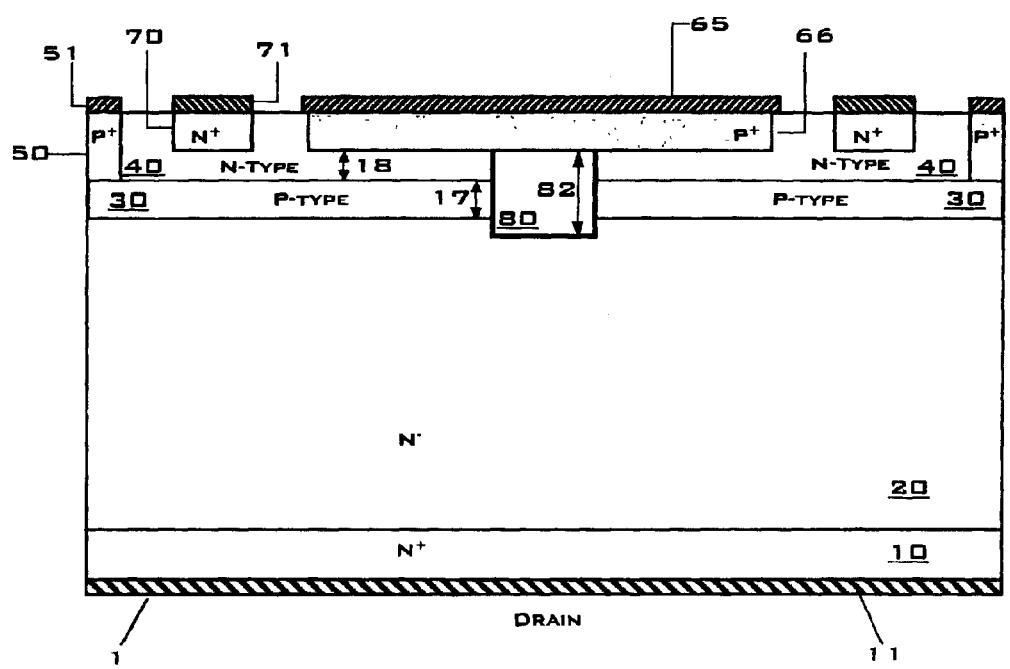
FIG. 4 is an enlarged sectional view of an alternate embodiment of the present invention having a merged gate design.

Referring now to FIG. 4, another embodiment of the present DG-VJFET 1 is composed of one large metal gate 65 with p+ subregion 66 by merging the two smaller p+ gates about the vertical channel 80 and reducing the channel depth 82 accordingly.

Although exemplary embodiments are shown in FIGS. 1–4, other alternatives to the present invention are possible. For example, the starting wafer may be a lightly doped bulk drift layer 20 as shown in FIG. 1A with a thickness determined by the desired blocking voltage, one example being a 100 micron thickness for a 10 kV blocking voltage. The heavily doped substrate 10 in FIG. 1A may be formed by n-type ion implantation of phosphorous or nitrogen or a combination of phosphorous and nitrogen into the sides of the drift layer 20. Besides, it should be obvious that FIG. 1A is a two-dimensional cross sectional view. In a three-dimensional design, the p+ subregion 50 is selectively implanted thereby not blocking source current flow from the source contact 71 towards the right side of the cell by going around the selectively implanted small p+ subregion 50.

Figure 5A:
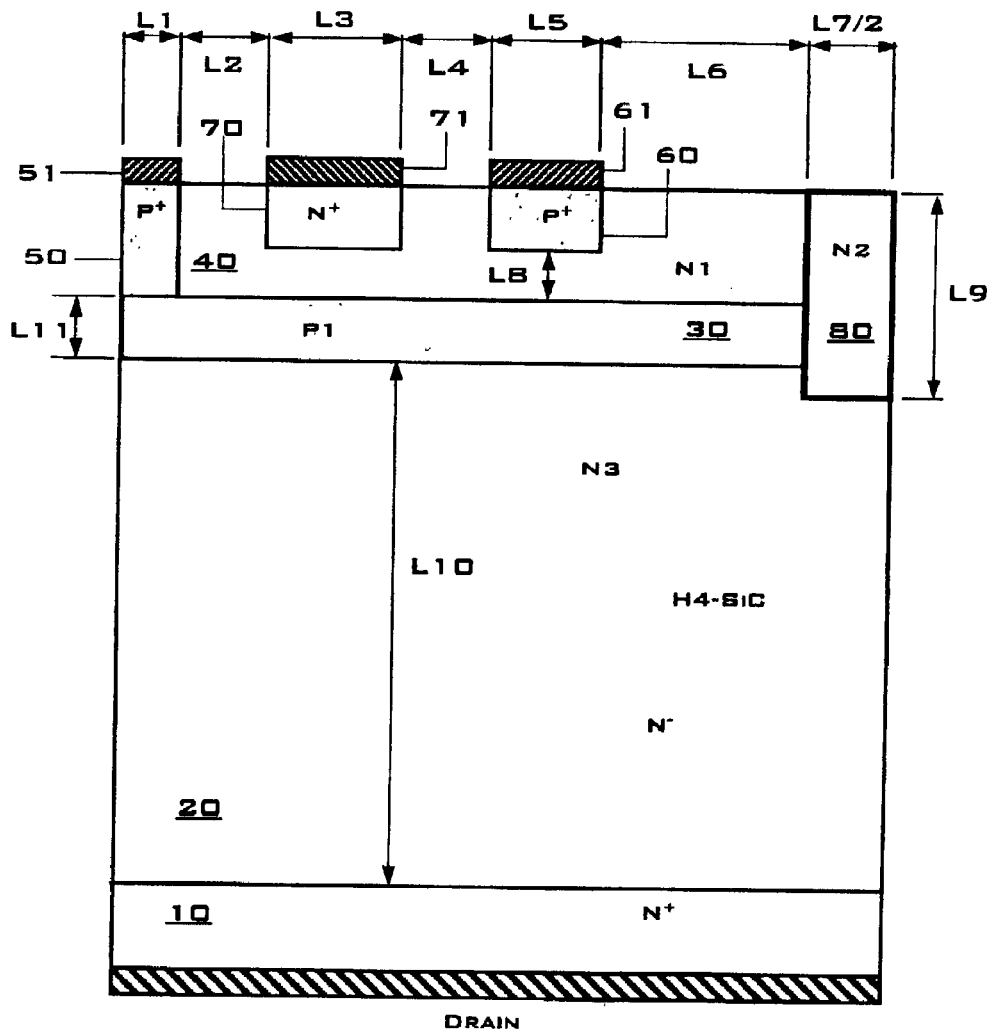
FIG. 5A is an enlarged sectional view showing one-half of a preferred embodiment for the present invention described in FIG. 1A.
Figure 5B:
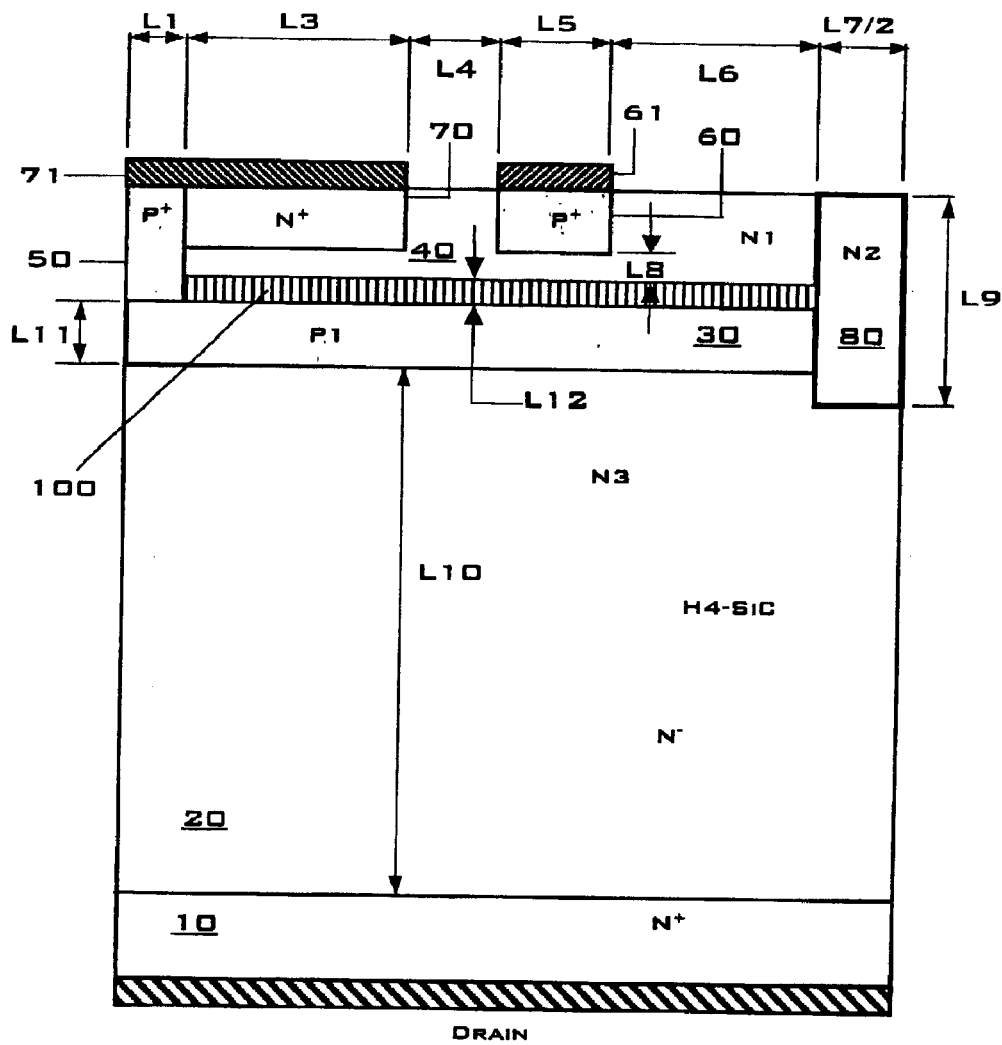
Figure 5C:
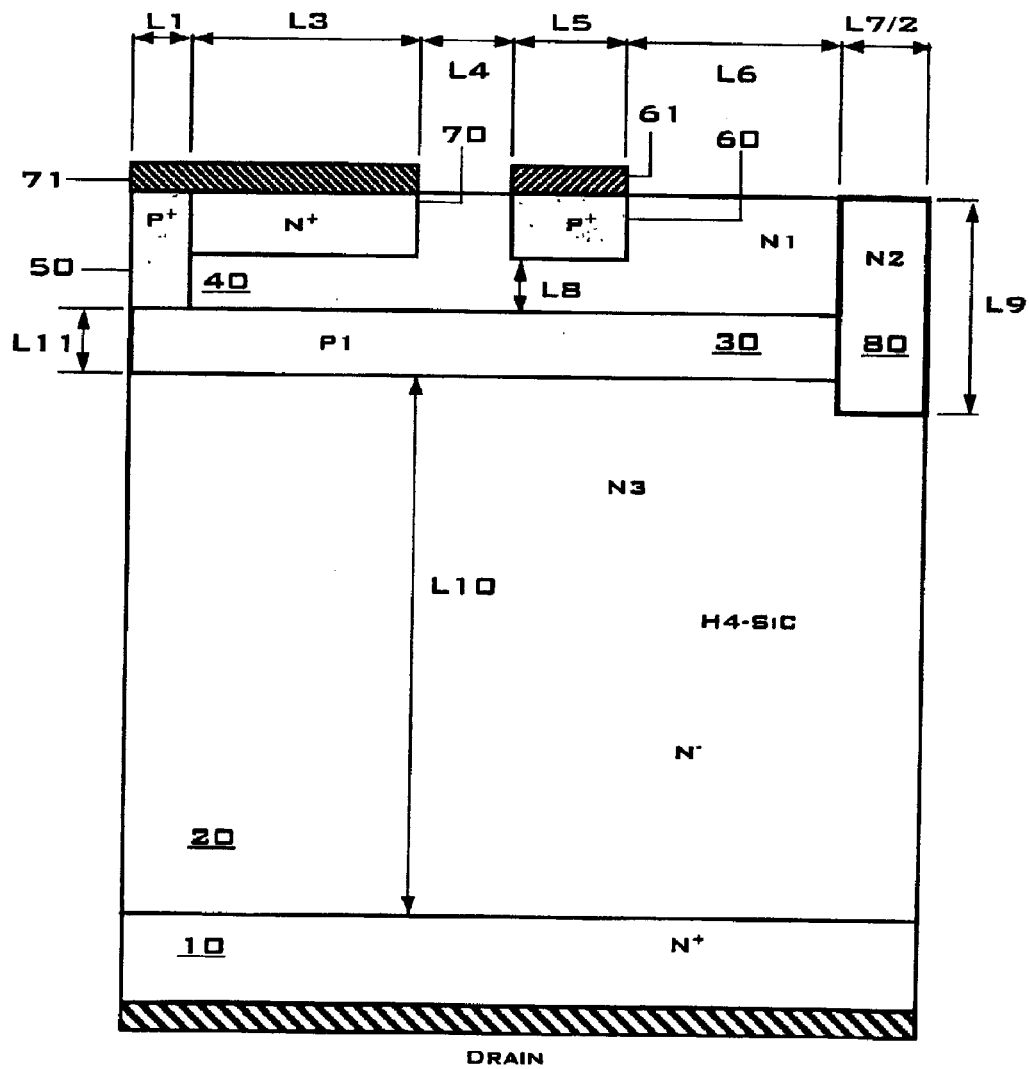
FIG. 5C is an enlarged sectional view showing one-half of a single-gated VJFET without semi-insulating layer.

FIGS. 5A, 5B and 5C provides a planar half-view of three power switch designs. One set of exemplary dimensional values and properties is shown in TABLE 1.

FIG. 5A shows a sectional view of an exemplary embodiment of the present DG-VJFET described in FIG. 1A. FIG. 5B shows a comparable single-gate VJFET having a semi-insulating layer 100 thereby preventing the parasitic p–n–p structure directly under the gate from turning ON. The p-type layer 30 does not function as a gate within the LJFET 12 and hence dimension L8 is half that in FIG. 5A. FIG. 5C shows a VJFET 13 without the semi-insulating layer 100 shown in FIG. 5B.

TABLE 1

| Value | FIG. 5A | FIG. 5B | FIG. 5C |
| --- | --- | --- | --- |
| L1 (µm) | 1 | 1 | 1 |
| L2 (µm) | 2 | — | — |
| L3 (µm) | 2 | 2 | 2 |
| L4 (µm) | 2 | 2 | 2 |
| L5 (µm) | 1.5 | 1.5 | 1.5 |
| L6 (µm) | 4.59 | 4.59 | 4.59 |
| L7 (µm) | 0.66 | 0.66 | 0.66 |
| L8 (µm) | 0.27 | 0.14 | 0.27 |
| L9 (µm) | 1.4 | 1.4 | 1.4 |
| L10 (µm) | 12 | 12 | 12 |
| L11 (µm) | .65 | .65 | .65 |
| L12 (µm) | — | 0.13 | — |
| N1 (cm$^{-3}$) | $9 \times 10^{16}$ | $9 \times 10^{16}$ | $9 \times 10^{16}$ |
| N2 (cm$^{-3}$) | $6 \times 10^{17}$ | $6 \times 10^{17}$ | $6 \times 10^{17}$ |
| N3 (cm$^{-3}$) | $7.2 \times 10^{15}$ | $7.2 \times 10^{15}$ | $7.2 \times 10^{15}$ |
| P1 (cm$^{-3}$) | $4.2 \times 10^{17}$ | $4.2 \times 10^{17}$ | $4.2 \times 10^{17}$ |

Figure 6:
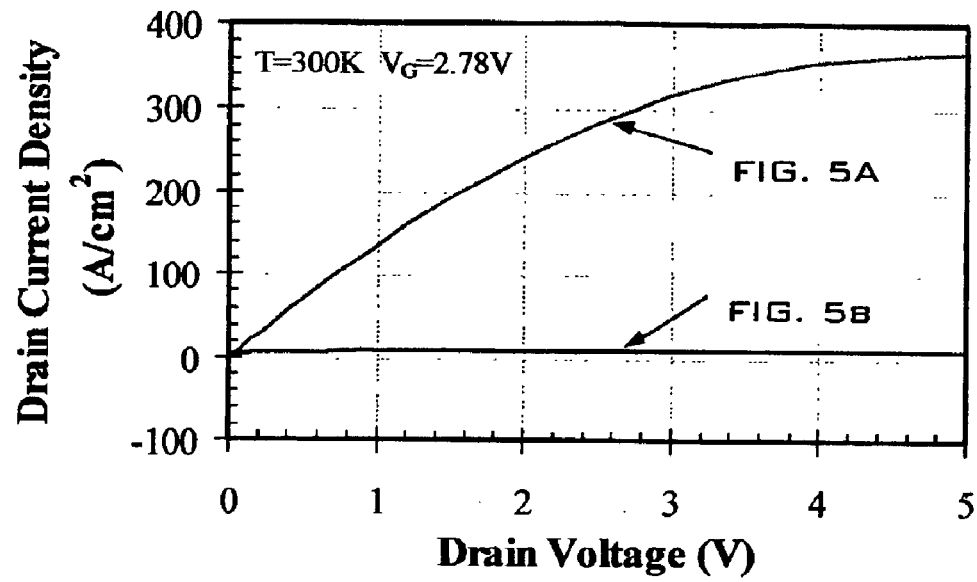
FIG. 6 is a Drain Current Density versus Drain Voltage plot comparing performance of present double-gated VJFET to a single-gated VJFET with semi-insulating layer.

FIG. 6 compares the forward current capability of switches shown in FIGS. 5A and 5B. The double-gate VJFET described in FIG. 5A drastically increases the forward current density through the device.

Figure 7:
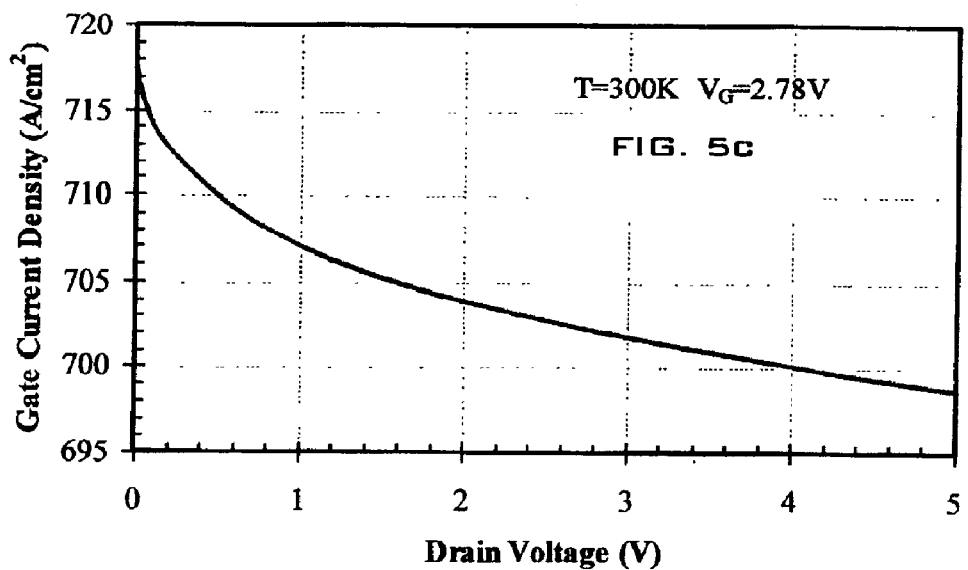
FIG. 7 is a Gate Current Density versus Drain Voltage plot showing the switch losses voltage control for a single-gated VJFET without semi-insulating layer.

FIG. 7 shows the gate current going through the LJFET 12 due to the punch-through of the parasitic p–n–p structure directly under the LJFET gate when semi-insulating layer 100 is removed, as shown in FIG. 5C. The large gate current indicates the switch is no longer a voltage controlled switch and therefore undesirable for practical system applications. A semi-insulating layer 100 which is formed by implanting suitable deep impurity ions such as V in SiC eliminates the parasitic p–n–p transistor turn-on problem but limits the total current capability where the power switch shown in FIG. 5B is designed for normally-off operation. Dimension L8 in FIGS. 5A–5C ensure each switch is normally-off at a predetermined high blocking voltage of around 1.5 kV, meaning the horizontal channel is completely depleted and the device conducts a low switch leakage current at a drain-to-source voltage of 1.5 kV when the gate bias voltage is zero.

The description above indicates that a great degree of flexibility is offered in terms of the DG-VJFET. Although the present invention has been described in considerable detail with reference to certain preferred versions thereof, other versions are possible. Therefore, the spirit and scope of the appended claims should not be limited to the description of the preferred versions contained herein.

What is claimed is:

1. A double-gated vertical junction field effect transistor comprising:
   (a) a low-voltage LJFET comprising a lateral channel double-gated by a first p+n junction and a second p+n junction along opposite sides of said lateral channel, a top gate forming said first p+n junction having a first p+ subregion formed by ion implantation, and a bottom gate forming by said second p+n junction composed of a buried p+ layer on top of an n− blocking layer, said buried p+ layer extending to a top surface along said double-gated vertical junction field effect transistor for electric connection to said top gate by implanting a second p+ subregion extending from said top surface down to said buried p+ layer; and
   (b) a high voltage VJFET having a vertical channel formed by converting a portion of said buried p+ layer to an n-type semiconductor by implantation, said vertical channel extending into a drift layer below said buried p+ layer.

2. The double-gated vertical junction field effect transistor of claim 1 wherein said buried p+ layer is separated from said n− voltage blocking layer by an n-type current spreading layer with doping concentration greater than that of said n− voltage blocking layer.

3. The double-gated vertical junction field effect transistor of claim 1 wherein said vertical channel has a trench.

4. The double-gated vertical junction field effect transistor of claim 3 wherein said buried p+ layer is separated from said n− voltage blocking layer by an n-type current spreading layer with doping concentration greater than that of said n− voltage blocking layer.

5. The double-gated vertical junction field effect transistor of claim 1 wherein said first p+ subregion is shaped so that said lateral channel has a reduced length.

6. The double-gated vertical junction field effect transistor of claim 5 wherein said buried p+ layer is separated from said n− voltage blocking layer by an n-type current spreading layer with doping concentration greater than that of said n− voltage blocking layer.

7. The double-gated vertical junction field effect transistor of claim 1 wherein said top gate extends over said vertical channel.

8. The double-gated vertical junction field effect transistor of claim 7 wherein said buried p+ layer is separated from said n− voltage blocking layer by an n-type current spreading layer with doping concentration greater than that of said n− voltage blocking layer.

* * * * *